(12) United States Patent
Jang

(10) Patent No.: US 6,350,364 B1
(45) Date of Patent: Feb. 26, 2002

(54) METHOD FOR IMPROVEMENT OF PLANARITY OF ELECTROPLATED COPPER

(75) Inventor: Syun-Ming Jang, Hsin-Chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/506,931

(22) Filed: Feb. 18, 2000

(51) Int. Cl.[7] .............................. C25D 5/02; C25D 7/12; C25D 5/10

(52) U.S. Cl. .................. 205/118; 205/157; 205/170; 205/182

(58) Field of Search ............................... 205/118, 157, 205/170, 182

(56) References Cited

U.S. PATENT DOCUMENTS

| | | | |
|---|---|---|---|
| 4,169,018 A | 9/1979 | Berdan et al. ............... 204/13 |
| 5,055,425 A | 10/1991 | Leibovitz et al. ........... 437/195 |
| 5,071,518 A | 12/1991 | Pan ........................... 205/122 |
| 5,256,565 A | * 10/1993 | Bernhardt et al. .......... 437/228 |
| 5,662,788 A | * 9/1997 | Sandhu et al. ............... 205/87 |
| 5,801,100 A | 9/1998 | Lee et al. .................... 438/678 |
| 5,821,168 A | * 10/1998 | Jain ............................ 438/692 |
| 5,968,333 A | * 10/1999 | Nogami et al. .............. 205/184 |
| 5,969,422 A | * 10/1999 | Ting et al. .................. 257/762 |
| 5,972,192 A | * 10/1999 | Dubin et al. ................ 205/101 |
| 6,168,704 B1 | * 1/2001 | Brown et al. ............... 205/118 |
| B16,224,737 | * 5/2001 | Tsai et al. .................. 205/123 |

* cited by examiner

Primary Examiner—Kathryn Gorgos
Assistant Examiner—Erica Smith-Hicks
(74) Attorney, Agent, or Firm—George O. Saile; Stephen B. Ackerman; Stephen G. Stanton

(57) ABSTRACT

A method for electroplating copper in trenches, including the steps of providing a semiconductor substrate having a trench formed therein and electrolytically depositing a first copper containing layer having an upper surface and a predetermined thickness within the trench. The first copper deposition step has a first ratio of brighteners concentration::levelers concentration. Then a second copper containing layer having an upper surface and a predetermined thickness is electrolytically deposited over the first copper containing layer. The second copper deposition step has a second ratio of brighteners concentration:levelers concentration that is less than the said first ratio of brighteners concentration:levelers concentration. The second copper containing layer upper surface having a greater planarity than the first copper containing layer upper surface due to an increased concentration of levelers relative to the brighteners in the electrolytic bath.

20 Claims, 1 Drawing Sheet

METHOD FOR IMPROVEMENT OF PLANARITY OF ELECTROPLATED COPPER

FIELD OF THE INVENTION

The present invention relates generally to methods for electroplating copper in damascene integrated circuit trenches to form conductive metal inter-connections between selected semiconductor devices on the integrated circuit.

BACKGROUND OF THE INVENTION

The damascene process is becoming important for interconnections in integrated circuit design. Currently, electroplating is applied for copper (Cu) trench- fill followed by chemical mechanical polishing (CMP) for planarization.

"Suppressing" and "brightening" agents are two types of organic additives commonly used in electroplating along with chloride. Suppressors, also known as "carriers" or "levelers" depending on specific functionality, are macromolecule deposition inhibitors that tend to adsorb over the wafer or substrate and reduce local deposition rates, while brighteners are organic molecules that tend to improve the specularity, or surface smoothness, of the deposit by reducing both surface roughness and grain-size variation. Brighteners interact with suppressors and compete for surface adsorption sites and locally accelerating deposition rates. For acid copper electroplating, most commercial electroplating mixtures use three organic components, i.e. brighteners, suppressors that comprise levelers and carriers, and chloride ions, which adsorb at the cathode during plating.

The general chemical characteristics of brighteners are water-soluble salts of organic acids containing a mercapto or thiol functional group. A typical example would be:

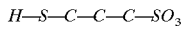

$$H\!-\!S\!-\!C\!-\!C\!-\!C\!-\!SO_3$$

present at 1 to 10 ppm concentration. Brighteners adsorb strongly on Cu metal during plating and participate in the charge transfer reaction. They determine Cu growth characteristics with major impact on ductility, smoothness, and hardness. Brighteners are the least stable of all additive components and are subject to oxidation by air (oxygen), electrochemical oxidation at the anode, and catalytic decomposition at the Cu surface. By-products of brighteners are often detrimental to deposit properties and control of brighteners during electroplating is relatively important and is the subject of most acid-Cu additive control.

The general chemical characteristics of levelers are a high molecular weight monomer or polymer with both sulfonic acid and nitrogen containing functional groups and are usually present at 10 to 100 ppm concentrations. The nitrogen containing groups are protonated in acid solution and adsorb strongly on Cu to inhibit plating. The exact chemical composition varies by supplier and application requirements. Levelers reduce Cu growth at edges and protrusions to yield a smoother final surface. They increase polarization resistance at high growth areas by either: inhibiting growth proportional to mass transfer at localized sites; or adsorbing more selectively at more cathodic (fast growing) sites. Levelers are relatively stable compared to brighteners.

The general chemical characteristics of carriers are oxygen-containing polymers containing no sulfur or nitrogen groups. Typical examples are polyethylene glycol or polyoxyethylene glycol of from 3000 to 8000 molecular weight. Carriers adsorb during Cu plating to form a relatively thick monolayer film at the cathode and moderately polarize Cu deposition by preventing diffusion of $Cu^{2+}$ ions to the surface. A carrier alone, or with $Cl^-$, yields good thickness distributions but poor fill and deposit properties. Carrier effect on plating is stable over a wide range of concentrations, from 10 to 1,000 ppm, and molecular weights from 800–1,000. Carriers are gradually broken into lower molecular weight fragments at both the anode and the cathode and tend to lose polarization effectiveness below a molecular weight of 750.

Chloride, as HCl, is an additive for nearly all commercial additive electroplating systems and is present at bath concentrations of 30 to 100 ppm. It adsorbs at both the cathode and anode and modifies adsorption properties of the carrier to influence thickness distribution. It accumulates in anode film and increases anode dissolution kinetics. Chloride does not decompose or complex irreversibly with other bath components and the bath chloride concentrations may shift inversely with the anode film chloride level.

For ultralarge-scale integration (ULSI) interconnect applications, the composition and concentrations of brighteners and suppressors are selected such that brightener surface concentration dominates on the interior surfaces of trenches and vias. Local deposition rates are thus suppressed at the top of topographical features relative to the insides, leading to the desired "bottom-up" deposition and void-free metal filing of the trenches and vias. In order to have sufficient Cu to cover the step height and to improve planarity before CMP, the thickness of the Cu layer has to be increased. However, increased thickness of the Cu layer leads to poor uniformity and lower CMP throughput.

U.S. Pat. No. 4,169,018 to Berden et al. describes a one step copper electroplating process for use on a carrier material, such as aluminum, and which yields a uniform, virtually pore-free copper ultra-thin foil with a nodularized surface for strong adherence to an epoxy resin impregnated fiber glass circuit board. The plating process comprises an acidic plating bath containing copper, nitrate, and fluoride ions which can be operated at a single-current density. The nitrate ion promotes nodularizing of the outer surface of the Cu foil while the fluoride ions increase Cu nucleation.

U.S. Pat. No. 5,821,168 to Jain describes a process for forming a semiconductor device in which an insulating layer is nitrided and then covered by a thin adhesion layer before depositing a composite copper layer. This process eliminates the need for a separate diffusion barrier since a portion of the insulating layer is converted to form a diffusion barrier film and the adhesion layer reacts with the interconnect material resulting in strong adhesion between the composite copper layer and the diffusion barrier film formed on the insulating layer. After a copper seed layer is deposited by physical vapor deposition over the adhesion layer using a collimated sputtering chamber, the substrate is taken to an electroplating system where 6,000–15,000 Å of copper is plated over the copper seed layer forming a composite copper layer with the copper seed layer indistinguishable from the plated copper layer. CMP then removes the composite copper layer overlying the uppermost surface of the insulating layer.

U.S. Pat. No. 5,055,425 to Leibovitz et al. describes a method for the formation of solid vias, preferably made of electroplated copper, which can be stacked, and shows a multi-layer copper and chromium metal line and interconnect structure.

U.S. Pat. No. 5,071,518 to Pan describes a method to fabricate an electrical multilayer interconnect having high density electrically conductive lines in a multilayer interconnect system in which the conductive lines can be protected by a protective coating. Copper may be used as the metal pillar and is plated by, for example, electroplating and electroless deposition.

U.S. Pat. No. 5,801,100 to Lee et al. describes an electroless copper plating method for forming integrated circuit structures within an integrated circuit. Interdiffusion of patterned copper containing conductor layers is avoided by employing patterned nickel containing conductor layers as barrier layers separating the patterned copper containing conductor layers from integrated circuit layers adjoining the copper containing integrated circuit inductor structure.

SUMMARY OF THE INVENTION

Accordingly, it is an object of the present invention to form a copper interconnect in an integrated circuit structure using a multiple step copper electroplating process.

Another object of the present invention is to form a copper interconnect in an integrated circuit structure using a multiple step copper electroplating process that reduces the thickness of the copper layer, shortening CMP times.

A further object of the present invention is to form a copper interconnect in an integrated circuit structure using a multiple step copper electroplating process that reduces the thickness of the copper layer, improving uniformity.

Yet another object of the present invention is to form a copper interconnect in an integrated circuit structure using a multiple step copper electroplating process that improves the planarity of the electroplated copper by reducing dishing and erosion.

Other objects and advantages of the present invention will become apparent from the following detailed description thereof, which includes the best mode contemplated for practicing the invention.

It has now been discovered that the above and other objects of the present invention may be accomplished in the following manner. Specifically, a semiconductor structure having a trench formed therein is provided. The semiconductor structure may be a substrate with an overlying interlevel metal dielectric layer having the trench. A first copper containing layer having an upper surface and a predetermined thickness is electrolytically deposited within the trench in an electrolytic bath having a composition and concentrations of brighteners and suppressors selected such that brightener surface concentration dominates on the interior surfaces of trench to enable a "bottom-up" trench filing Cu deposition. Then a second copper containing layer having an upper surface and a predetermined thickness is electrolytically deposited over the first copper containing layer in an electrolytic bath having an increased concentration of leveler than in the first electrolytic bath, wherein the second copper containing layer upper surface has a greater planarity than the first copper containing layer upper surface. The structure is then planarized by CMP achieving a greater CMP throughput due to the more planarized second copper containing layer.

BRIEF DESCRIPTION OF THE DRAWINGS

The features and advantages of the method according to the present invention and further details of that method in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Figure 1:
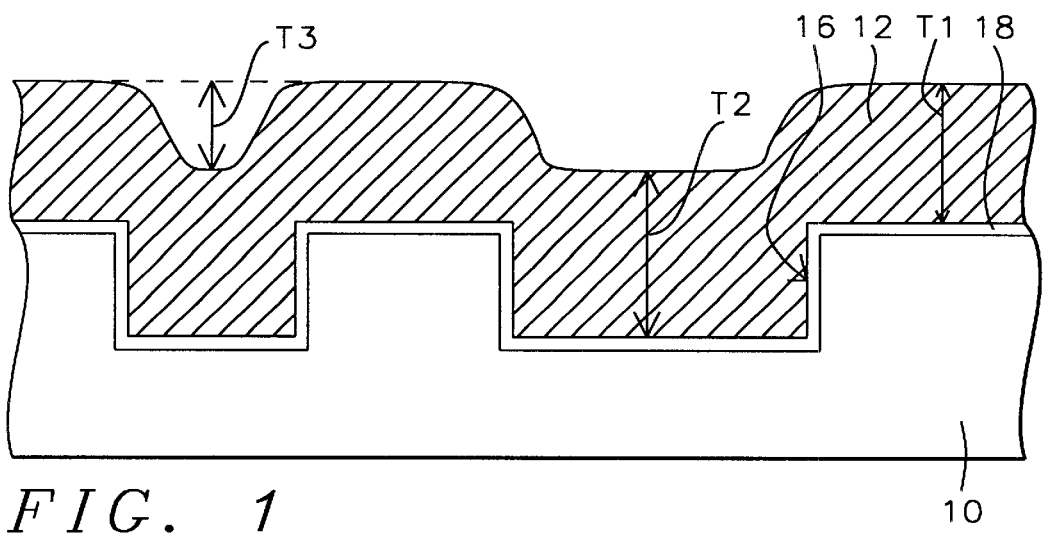
FIGS. 1 to 3 show a series of schematic cross-sectional diagrams illustrating the results of progressive stages in electroplating copper, within an intermetal dielectric layer, for example, employed in integrated circuit fabrication, in accordance with a preferred embodiment of the method of the present invention.

Accordingly, as shown in FIG. 1, a semiconductor structure 10, such as an intermetal dielectric (IMD) layer, has trenches 16 that may be formed therein by various conventional methods and equipment well known in the art. It is noted that trenches 16 may be vias or any other like structure and various layers, not shown, may comprise semiconductor structure 10. These various layers may include lower levels of metallization, gate electrodes, isolation regions, capacitors or other features.

The trenched semiconductor structure 10 is prepared for copper electroplating which may include the addition of a diffusion barrier layer, an adhesion layer, and/or a metallization layer generally shown as layer 18. Layer 18 may be a multilayer structure including: a lower barrier layer comprised of TaN or Ta from about 150 to 300 Å thick; and an upper copper (Cu) seed layer from about 1000 to 1500 Å thick. Both the barrier layer and Cu seed layers of layer 18 may be deposited by PVD.

According to the present invention, a Cu containing layer is then electroplated over layer 18 and onto semiconductor structure 10 to filling trenches 16 and blanketing semiconductor structure 10 to form a first Cu containing electroplated layer 12 under the following electroplating parameters:

a pH from about 2 to about 5 and more preferably about 3;

a current density from about 10 to about 25 ma/cm$^2$ and more preferably about 15 ma/cm$^2$ a temperature from about 15 to about 25° C. and more preferably about 20 degrees C.;

agitation from about 200 to about 400 rpm and more preferably 300 rpm;

Three additives are added to the electrolyte solution, i.e. a leveler, a carrier and a brightening agent. Such additives are readily available from electrolyte vendors such as Shipley and Enthone—OMI.

Leveler concentration: from about 10 to 100 ppm;

Carrier concentration: from about 100 to 1000 ppm;

Brightening agent concentration: from about 1 to 10 ppm; and

Equipment used: Semitool electroplating tool manufactured by Novellus.

For this first gap, or trench, filling step, the above composition and concentrations of brighteners and suppressors are selected such that brightener surface concentration dominates on the interior surfaces of trenches 16, suppressing local deposition rates at the top of topographical features relative to the insides, causing the desired "bottom-up" deposition and void-free metal filing of trenches 16. The thickness of the first Cu layer 12 over trenched semiconductor structure 10 is less than in prior electroplating methods. The following are the thicknesses and step height of Cu layer 12 as indicated in FIG. 1:

thickness T1, the height above the upper surface of semiconductor structure 10, is from about 4000 to 8000 Å and more preferably about 6000 Å;

thickness T2, the height above the trenches 16, is from about 2000 to 6000 Å and more preferably about 4000 Å; and step height T3 is from about 1000 to 3000 Å and more preferably about 2000 Å.

A second Cu containing layer 14 is then electrolytically deposited with an increased leveler concentration over first Cu containing electroplated layer 12 to form a sacrificial second Cu containing layer under the following electroplating parameters:

pH from about 2 to about 5 and more preferably about 3;

current density from about 10 to about 20 ma/cm$^2$ and more preferably about 15 ma/cm$^2$;

temperature from about 15 to about 20° C. and more preferably about 20 degrees C.; and agitation from about 200 to about 400 rpm and more preferably about 300 rpm.

Three additives are added to the electrolyte solution, i.e. a leveler, a carrier and a brightening agent. Such additives are readily available from electrolyte vendors such as Shipley and Enthone—OMI.

Leveler concentration: from about 100 to 1000 ppm;

Carrier concentration: from about 100 to 1000 ppm;

Brightening agent concentration: from about 1 to 5 ppm; and

Equipment used: Semitool electroplating tool manufactured by Novellus.

Figure 2:
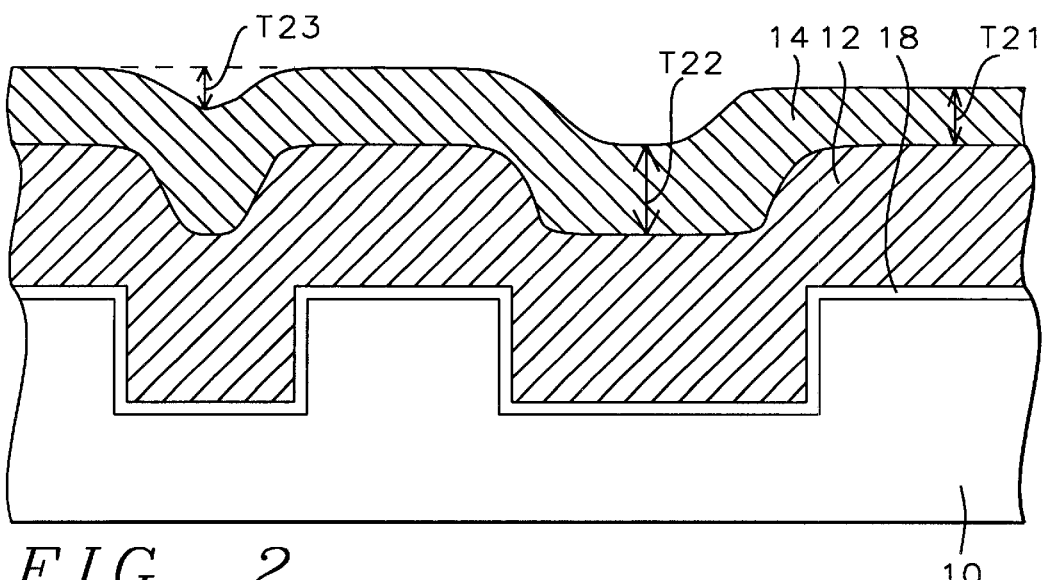

For the second electroplating step to form second Cu layer 14, the increased concentration of leveler(s) allows for reduced Cu growth at edges and protrusions, yielding a smoother final surface as shown in FIG. 2. This two step process of the present invention permits a lower overall thickness of Cu, with a better planarity, to be deposited to achieve a desired planarity for CMP by depositing an second Cu layer 14 having an upper surface with better planarity and uniformity allowing for an increased CMP throughput.

Although with increased concentrations of levelers, more impurities are present in any electroplated layer, as noted below, the second Cu layer 14 having the greater impurities is a sacrificial layer and is eliminated during CMP. The following are the thicknesses and step height of second Cu layer 14 over first Cu layer 12 as indicated in FIG. 2:

thickness T21, the height above the upper surface of first Cu containing layer 12, is from about 1000 to 2000 Å and more preferably about 1500 Å;

thickness T22, the height above the upper surface of first Cu containing layer 12 over trenches 16, is from about 3000 to 4000 Å and more preferably about 3500 Å; and step height T23 is from, is from about 1000 to 1500 Å and more preferably about 1250 Å (as low as possible).

The combined respective thicknesses of first Cu layer 12 and second Cu layer 14 at (T1+T21) and (T2+T22) is less than prior methods of electroplating a single layer of Cu over IMD 10 by electroplating with a selected composition and concentrations of brighteners and suppressors causing "bottom-up" deposition and void-free metal filing of trenches 16. This is because a thicker layer of Cu in a single electroplating step must be deposited to achieve an acceptable level of initial planarity (to have good quality, the planarity is usually not good) and reduced dishing before CMP. Also, due to the two step Cu electroplating method of the present invention, step height T23 of second Cu layer 14 is significantly less than step height T3 of first Cu layer 12 allowing for a higher CMP throughput.

The ratio of brighteners concentration:levelers concentration ([brighteners]:[levelers])to form the first Cu electroplated layer 12 is about 1:8 to about 1:12 and more preferably from about 1:10, while the ratio of brighteners concentration:levelers concentration to form the second Cu electroplated layer 14 is about 1:80 to about 1:120 and more preferably from about 1:100.

In summary:

| | [brighteners]:[levelers] |
|---|---|
| 1$^{st}$ Cu layer formation | from about 1:8 to 1:12; more preferably about 1:10 |
| 2$^{nd}$ Cu layer formation | from about 1:80 to 1:120; more preferably about 1:100 |

Figure 3:
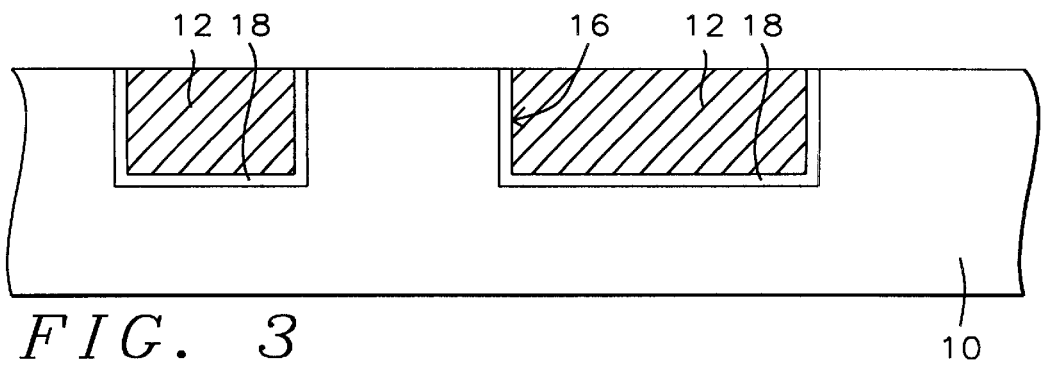

The structure shown in FIG. 2 is planarized by CMP, sacrificing all of second Cu containing layer 14, to form the planarized structure shown in FIG. 3 under the following conditions:

slurry type: $Al_2O_3$ or $SiO_2$ abrasives+$H_2O_2$+DI (deionized water);

pH value of slurry: from about 5 to 7;

slurry flow: from about 200 to 400 sccm;

process temperature: from about 20 to 50° C.;

polish pressure: from about 2 to 4 psi;

back pressure: from about 1 to 2 psi;

platen speed: from about 30 to 70 rpm or from about 200 to 400 fpm (feet per minute); and pad type: polyurethane.

The CMP may also be accomplished by various conventional methods and equipment well known in the art Since second Cu layer 14, that includes greater impurities due to the increased concentrations of leveler(s) during its deposition, is completely eliminated during CMP, the remaining planarized Cu within trenches 16 is of an acceptable and higher purity Cu providing better performance.

While particular embodiments of the present invention have been illustrated and described, it is not intended to limit the invention, except as defined by the following claims.

I claim:

1. A method for electroplating copper in a trench, the steps comprising:

providing a semiconductor structure having a trench formed therein;

depositing by electrolysis a first copper containing layer having an upper surface and a predetermined thickness within said trench; said first copper deposition having a first ratio of brighteners concentration:levelers concentration; and depositing by electrolysis a second copper containing layer having an upper surface and a predetermined thickness over said first copper containing layer within said trench, wherein said second copper containing layer upper surface has a greater planarity than said first copper containing layer upper surface and said second copper deposition having a second ratio of brighteners concentration:levelers concentration that is less than said first ratio of brighteners concentration:levelers concentration.

2. The method of claim 1, further including the step of planarizing said second copper containing layer and said first copper containing layer to form a planarized gap filling copper containing trench filled layer.

3. The method of claim 1, further including the step of planarizing said second copper containing layer and said first copper containing layer to form a planarized gap filling copper containing trench filled layer, wherein said semiconductor structure is a substrate with an overlying interlevel metal dielectric layer, wherein a metallization layer is formed on said interlevel metal dielectric layer having said trench and said first copper containing layer is formed over said metallization layer.

4. The method of claim 1, further including the step of planarizing said second copper containing layer and said first copper containing layer to form a planarized gap filling copper containing trench filled layer, wherein said second copper containing layer is completely eliminated by said planarizing.

5. The method of claim 1, wherein said first ratio of brighteners concentration:levelers concentration is from about 1:8 to 1:12 and said second ratio of brighteners concentration:levelers concentration is from about 1:80 to 1:120.

6. The method of claim 1, wherein said first ratio of levelers:brighteners is about 1:10 and said second ratio of levelers:brighteners is about 1:100.

7. The method of claim 1, wherein said first copper containing layer has a thickness above said semiconductor structure of from about 4000 to about 8000 Å and said second copper containing layer has a thickness above said semiconductor structure of from about 1000 to about 2000 Å.

8. The method of claim 1, wherein said first copper containing layer has a thickness above said semiconductor structure of about 6000 Å and said second copper containing layer has a thickness above said semiconductor structure of about 1500 Å.

9. The method of claim 1, wherein said first copper containing layer thickness within said trench is from about 2000 to about 6000 Å, and said second copper containing layer thickness over said first copper containing layer within said trench is from about 3000 to about 4000 Å.

10. The method of claim 1, wherein said first copper containing layer thickness within said trench is about 4000 Å, and said second copper containing layer thickness over said first copper containing layer within said trench is about 3500 Å.

11. A method for electroplating copper in a trench, the steps comprising:
providing a semiconductor structure having a trench formed therein, wherein said semiconductor structure is a substrate with an overlying interlevel metal dielectric layer having said trench;
forming a metallization layer on said interlevel metal dielectric layer;
depositing by electrolysis a first copper containing layer having an upper surface and a predetermined thickness within said trench over said metallization layer; said first copper deposition having a first ratio of brighteners concentration:levelers concentration;
depositing by electrolysis a second copper containing layer having an upper surface and a predetermined thickness over said first copper containing layer within said trench, wherein said second copper containing layer upper surface has a greater planarity than said first copper containing layer upper surface and said second copper deposition having a second ratio of brighteners concentration:levelers concentration that is less than said first ratio of brighteners concentration:levelers concentration; and
planarizing said second copper containing layer and said first copper containing layer to form a planarized gap filling copper containing trench filled layer.

12. The method of claim 11, wherein said first ratio of brighteners concentration:levelers concentration is from about 1:8 to 1:12 and said second ratio of brighteners concentration:levelers concentration is from about 1:80 to 1:120.

13. The method of claim 11, wherein said first ratio of levelers:brighteners is about 1:10 and said second ratio of levelers:brighteners is about 1:100.

14. The method of claim 11, wherein said first copper containing layer has a thickness above said interlevel metal dielectric layer of from about 4000 to about 8000 Å and said second copper containing layer has a thickness above said interlevel metal dielectric layer of from about 1000 to about 2000 Å.

15. The method of claim 11, wherein said first copper containing layer has a thickness above said interlevel metal dielectric layer of about 6000 Å and said second copper containing layer has a thickness above said interlevel metal dielectric layer of about 1500 Å.

16. The method of claim 11, wherein said first copper containing layer thickness within said trench is from about 2000 to about 6000 Å, and said second copper containing layer thickness over said first copper containing layer within said trench is from about 3000 to about 4000 Å.

17. The method of claim 11, wherein said first copper containing layer thickness within said trench is about 4000 Å, and said second copper containing layer thickness over said first copper containing layer within said trench is about 3500 Å.

18. A method for electroplating copper in a trench, the steps comprising:
providing a semiconductor structure having a trench formed therein, wherein said semiconductor structure is a substrate with an overlying interlevel metal dielectric layer having said trench;
forming a metallization layer on said interlevel metal dielectric layer;
depositing by electrolysis a first copper containing layer having an upper surface and a predetermined thickness of from about 2000 to about 6000 Å within said trench over said metallization layer;
depositing by electrolysis a second copper containing layer having an upper surface and a predetermined thickness of from about 3000 to about 4000 Å over said first copper containing layer, wherein said second copper containing layer upper surface has a greater planarity than said first copper containing layer upper surface; and
planarizing said second copper containing layer and said first copper containing layer to form a planarized gap filling copper containing trench filled layer whereby said second copper containing layer is completely eliminated by said planarizing;
wherein said electrolytic deposition of said first copper containing layer has a first ratio of brighteners concentration:levelers concentration, and said electrolytic deposition of said second copper containing layer has a second ratio of brighteners concentration levelers concentration that is less than said first ratio of brighteners concentration:levelers concentration.

19. The method of claim 18, wherein said first ratio of brighteners concentration:levelers concentration is from about 1:8 to 1:12 and said second ratio of brighteners concentration:levelers concentration is from about 1:80 to 1:120.

20. The method of claim 18, wherein said first ratio of levelers:brighteners is about 1:10 and said second ratio of levelers:brighteners is about 1:100.

* * * * *